(12) United States Patent
Hou et al.

(10) Patent No.: US 11,979,134 B2
(45) Date of Patent: May 7, 2024

(54) COMPOSITE PIEZOELECTRIC FILM AND BULK ACOUSTIC RESONATOR INCORPORATING SAME

(71) Applicant: Global Communication Semiconductors, LLC, Torrance, CA (US)

(72) Inventors: Liping D. Hou, Torrance, CA (US); Shing-Kuo Wang, Torrance, CA (US)

(73) Assignee: GLOBAL COMMUNICATION SEMICONDUCTORS, LLC, Torrance, CA (US)

( * ) Notice: Subject to any disclaimer, the term of this patent is extended or adjusted under 35 U.S.C. 154(b) by 618 days.

(21) Appl. No.: 17/071,831

(22) Filed: Oct. 15, 2020

(65) Prior Publication Data

US 2021/0111693 A1   Apr. 15, 2021

Related U.S. Application Data

(60) Provisional application No. 62/915,588, filed on Oct. 15, 2019, provisional application No. 62/915,577, (Continued)

(51) Int. Cl.
*H03H 9/02* (2006.01)
*H03H 9/13* (2006.01)
(Continued)

(52) U.S. Cl.
CPC .... *H03H 9/02015* (2013.01); *H03H 9/02102* (2013.01); *H03H 9/0211* (2013.01); (Continued)

(58) Field of Classification Search
CPC .......... H03H 9/02015; H03H 9/02102; H03H 9/0211; H03H 9/02118; H03H 9/131; (Continued)

(56) References Cited

U.S. PATENT DOCUMENTS 4,320,365 A   3/1982 Black et al.
4,456,850 A   6/1984 Inoue et al.
(Continued)

FOREIGN PATENT DOCUMENTS

WO   WO2020132997 A1   7/2020

OTHER PUBLICATIONS

Yoo et al., Spurious Resonances and Modelling of Composite Resonators, Department of Physics, The Catholic University of America, Washington, D.C., © 1983 IEEE, 3 pgs.
(Continued)

*Primary Examiner* — John W Poos
(74) *Attorney, Agent, or Firm* — Morgan, Lewis & Bockius LLP

(57) ABSTRACT

A bulk acoustic wave resonator with better performance and better manufacturability is described. The bulk acoustic wave resonator includes a composite piezoelectric film. The composite piezoelectric film includes a first sublayer of a first piezoelectric material, a second sublayer of a second piezoelectric material, and a third sublayer of a third piezoelectric material that is disposed between the first sublayer and the second sublayer. The first piezoelectric material has a first lattice constant, the second piezoelectric material has a second lattice constant, and the third piezoelectric material has a third lattice constant that is distinct from the first lattice constant and from the second lattice constant. The composite piezoelectric film may include a sequence of alternating sublayers of two or more distinct piezoelectric materials, or a sequence of composition graded layers having gradually changing composition.

16 Claims, 11 Drawing Sheets

Related U.S. Application Data filed on Oct. 15, 2019, provisional application No. 62/915,573, filed on Oct. 15, 2019, provisional application No. 62/915,581, filed on Oct. 15, 2019.

(51) Int. Cl.
*H03H 9/17* (2006.01)
*H10N 30/00* (2023.01)
*H10N 30/85* (2023.01)

(52) U.S. Cl.
CPC ........ *H03H 9/02118* (2013.01); *H03H 9/131* (2013.01); *H03H 9/17* (2013.01); *H03H 9/173* (2013.01); *H10N 30/1051* (2023.02); *H10N 30/85* (2023.02)

(58) Field of Classification Search
CPC .... H03H 9/17; H03H 9/173; H03H 2003/021; H03H 3/02; H10N 30/1051; H10N 30/85; H10N 30/50; H10N 30/853
See application file for complete search history.

(56) References Cited

U.S. PATENT DOCUMENTS

| | | |
|---|---|---|
| 5,448,014 A | 9/1995 | Kong et al. |
| 5,578,974 A | 11/1996 | Yang et al. |
| 5,587,620 A | 12/1996 | Ruby et al. |
| 5,873,153 A | 2/1999 | Ruby et al. |
| 5,894,647 A | 4/1999 | Lakin |
| 6,060,818 A | 5/2000 | Ruby et al. |
| 6,150,703 A | 11/2000 | Cushman et al. |
| 6,262,637 B1 | 7/2001 | Bradley et al. |
| 6,278,342 B1 | 8/2001 | Ella |
| 6,424,237 B1 | 7/2002 | Ruby et al. |
| 6,693,500 B2 | 2/2004 | Yang et al. |
| 6,828,713 B2 | 12/2004 | Bradley et al. |
| 6,842,088 B2 | 1/2005 | Yamada et al. |
| 7,327,073 B2 | 2/2008 | Shearer et al. |
| 7,345,410 B2 | 3/2008 | Grannen et al. |
| 7,408,428 B2 | 8/2008 | Larson, III |
| 7,522,018 B2 | 4/2009 | Milsom et al. |
| 7,737,806 B2 | 6/2010 | Taniguchi et al. |
| 8,896,395 B2 | 11/2014 | Burak et al. |
| 9,197,185 B2 | 11/2015 | Zou et al. |
| 9,246,079 B2 | 1/2016 | Umeda et al. |
| 9,246,473 B2 | 1/2016 | Burak et al. |
| 9,374,059 B1 | 6/2016 | Hurwitz et al. |
| 9,401,692 B2 | 7/2016 | Burak |
| 9,479,139 B2 | 10/2016 | Ruby et al. |
| 9,634,643 B2 | 4/2017 | Shin et al. |
| 9,842,980 B2 | 12/2017 | Park et al. |
| 10,079,334 B2 | 9/2018 | Moulard et al. |
| 10,298,197 B2 | 5/2019 | Lee et al. |
| 10,601,391 B2 | 3/2020 | Stokes et al. |
| 11,736,088 B2 | 8/2023 | Stokes et al. |
| 11,764,750 B2 | 9/2023 | Hou et al. |
| 11,817,839 B2 | 11/2023 | Wang et al. |
| 11,909,373 B2 | 2/2024 | Wang et al. |
| 2005/0012568 A1* | 1/2005 | Aigner .................. H03H 9/174 333/187 |
| 2007/0001544 A1 | 1/2007 | Geefay |
| 2008/0111452 A1 | 5/2008 | Koizumi et al. |
| 2010/0148637 A1 | 6/2010 | Satou |
| 2011/0080233 A1 | 4/2011 | Petit et al. |
| 2011/0227671 A1 | 9/2011 | Zhang |
| 2011/0266917 A1 | 11/2011 | Metzger et al. |
| 2011/0298564 A1 | 12/2011 | Iwashita et al. |
| 2012/0205754 A1 | 8/2012 | Iwamoto |
| 2013/0049545 A1 | 2/2013 | Zou et al. |
| 2013/0057115 A1 | 3/2013 | Saito et al. |
| 2013/0140959 A1 | 6/2013 | Shin et al. |
| 2014/0117815 A1 | 5/2014 | Bi et al. |
| 2014/0125203 A1* | 5/2014 | Choy .................. H03H 9/173 310/365 |
| 2014/0354109 A1* | 12/2014 | Grannen ................ H03H 9/171 310/311 |
| 2016/0065171 A1 | 3/2016 | Ruby et al. |
| 2016/0294354 A1 | 10/2016 | Saijo et al. |
| 2016/0352309 A1 | 12/2016 | Xu et al. |
| 2017/0077385 A1 | 3/2017 | Stokes et al. |
| 2017/0149405 A1 | 5/2017 | Kishimoto |
| 2017/0338399 A1 | 11/2017 | Kim et al. |
| 2018/0138885 A1* | 5/2018 | Stokes ............... H03H 9/02047 |
| 2019/0149129 A1 | 5/2019 | Ueda |
| 2019/0356293 A1 | 11/2019 | Kim et al. |
| 2019/0379344 A1 | 12/2019 | Wang et al. |
| 2020/0028482 A1 | 1/2020 | Hou et al. |
| 2020/0220520 A1 | 7/2020 | Stokes et al. |
| 2020/0235718 A1 | 7/2020 | Modarres-Zadeh et al. |
| 2020/0313648 A1 | 10/2020 | Wang et al. |
| 2020/0389150 A1 | 12/2020 | Wang et al. |
| 2021/0006220 A1 | 1/2021 | Schiek et al. |
| 2021/0099156 A1 | 4/2021 | Kirkendall et al. |
| 2021/0111699 A1 | 4/2021 | Hou et al. |
| 2021/0111701 A1 | 4/2021 | Hou et al. |
| 2021/0111702 A1 | 4/2021 | Wang et al. |
| 2021/0143792 A1 | 5/2021 | Pollard |
| 2021/0250012 A1 | 8/2021 | Hou et al. |
| 2022/0416149 A1 | 12/2022 | Hou et al. |

OTHER PUBLICATIONS

Yoo et al., Spurious Resonances in Bulk Acoustic Wave Resonators, Department of Physics, The Catholic University of America, Washington, D.C., © 1982 IEEE, 1982 Ultrasonics Symposium, 4 pgs.
Working principles and Applications of SAW/FBAR Devices, Taiyo Yuden Navigator, Oct. 2017, 6 pgs.
Stokes, Notice of Allowance, U.S. Appl. No. 15/789,109, dated Nov. 14, 2019, 11pgs.
Wang, Office Action, U.S. Appl. No. 16/368,754, dated Jul. 13, 2022, 7pgs.
Wang, Office Action, U.S. Appl. No. 17/002,498, dated Jul. 12, 2022, 12pgs.
Global Communication Semiconductors, Inc., Restriction Election, U.S. Appl. No. 16/455,627, dated Aug. 19, 2022, 7 pgs.
Global Communication Semiconductors, Inc., U.S. Non-Final Office Action, U.S. Appl. No. 16/455,627, dated Dec. 20, 2022, 8 pgs.
Global Communication Semiconductors, Inc., Restriction Election, U.S. Appl. No. 17/071,836, dated Jun. 21, 2023, 7 pgs.
Global Communication Semiconductors, Inc., U.S. Non-Final Office Action, U.S. Appl. No. 16/820,625, dated Nov. 14, 2022, 10 pgs.
Global Communication Semiconductors, Inc., U.S. Final Office Action, U.S. Appl. No. 17/002,498, dated Jun. 7, 2023, 16 pgs.
Global Communication Semiconductors, Inc., U.S. Notice of Allowance, U.S. Appl. No. 16/820,625, dated Apr. 5, 2023, 8 pgs.
Global Communication Semiconductors, Inc., Restriction Election, U.S. Appl. No. 17/071,810, dated Aug. 9, 2023, 7 pgs.
Global Communication Semiconductors, Inc., U.S. Non-Final Office Action, U.S. Appl. No. 17/071,836, dated Aug. 1, 2023, 13 pgs.
Global Communication Semiconductors, Inc., U.S. Final Office Action, U.S. Appl. No. 17/071,836, Feb. 28, 2024, 17 pgs.
Global Communication Semiconductors, Inc., U.S. Notice of Allowance, U.S. Appl. No. 17/071,810, Jan. 23, 2024, 14 pgs.

\* cited by examiner

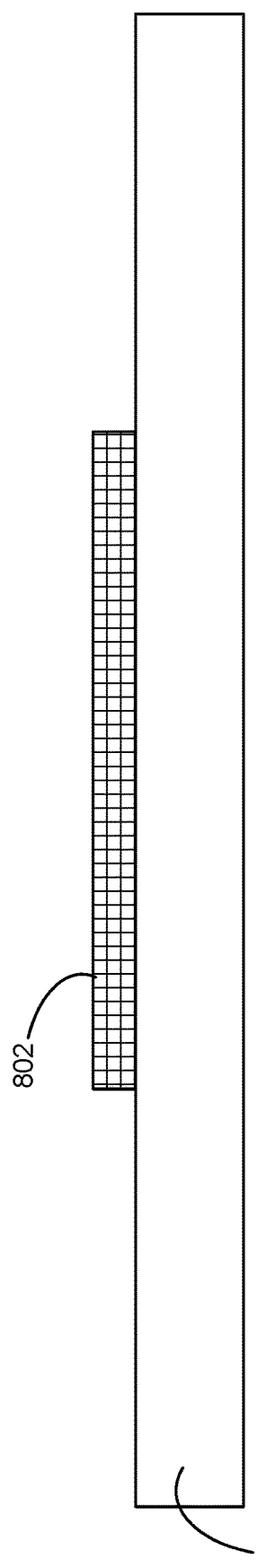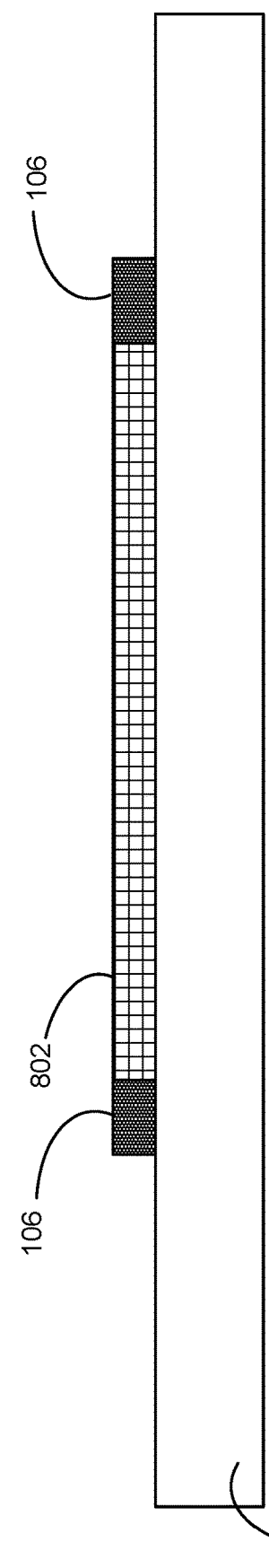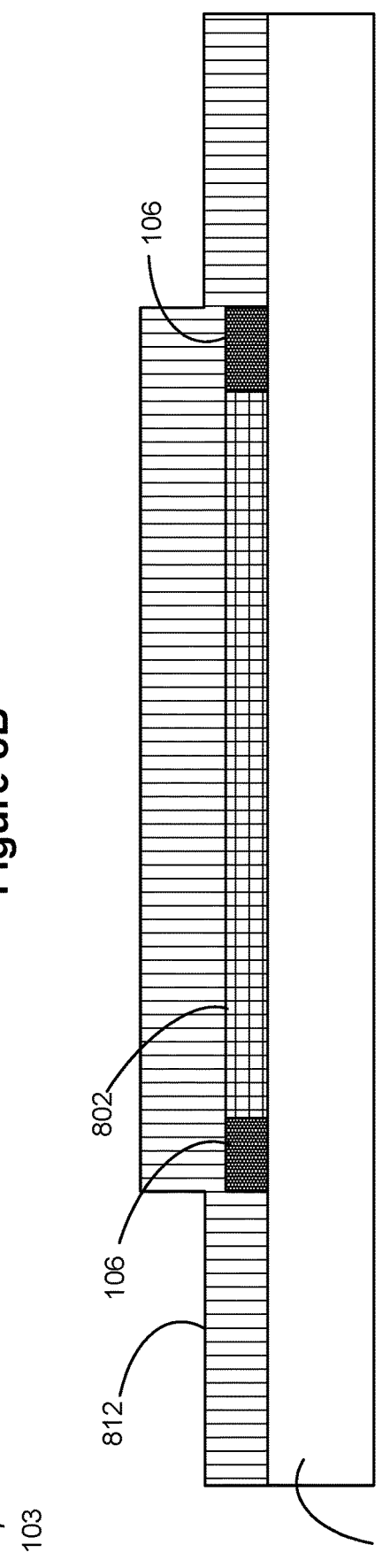

COMPOSITE PIEZOELECTRIC FILM AND BULK ACOUSTIC RESONATOR INCORPORATING SAME

RELATED APPLICATIONS

This application claims priority to U.S. Provisional Patent Application No. 62/915,577, filed Oct. 15, 2019, U.S. Provisional Patent Application No. 62/915,573, filed Oct. 15, 2019, U.S. Provisional Patent Application No. 62/915,581, filed Oct. 15, 2019, and U.S. Provisional Patent Application No. 62/915,588, filed Oct. 15, 2019, each which is hereby incorporated by reference in its entirety.

This application is related to U.S. patent application Ser. No. 17/071,810, filed Oct. 15, 2020, entitled "Bulk Acoustic Wave Resonator with Multilayer Base," U.S. patent application Ser. No. 17/071,836, filed Oct. 15, 2020, entitled "Bulk Resonator with Symmetrically Positioned Temperature Compensation Layers," and U.S. patent application Ser. No. 17/071,849, filed Oct. 15, 2020, entitled "Bulk Acoustic Resonator Structures with Improved Edge Frames," each of which is hereby incorporated by reference in its entirety.

TECHNICAL FIELD

The disclosed embodiments relate generally to bulk acoustic wave resonators, and in particular, to a composite piezoelectric film for improved bulk resonators and a bulk acoustic resonator including same.

BACKGROUND

Bulk acoustic wave BAW resonators are widely used in RF filters in mobile devices due to their compact size and high performance. A BAW resonator typically includes a piezoelectric thin film layer between a bottom electrode and a top electrode. When an oscillating electrical signal is applied between the top and bottom electrodes, the piezoelectric thin film layer converts the oscillating electrical signal into bulk acoustic waves. The resonance frequency of the BAW resonator is mainly determined by the acoustic velocity, the thickness of the piezoelectric layer and those of the electrodes. Piezoelectric thin film materials used for BAW devices include AlN, ZnO thin films for small bandwidth applications, and PZT films for wide bandwidth applications. The performance of BAW resonators rely heavily on the quality of the piezoelectric films therein.

SUMMARY

According to some embodiments, a composite piezoelectric film comprises: a first sublayer of a first piezoelectric material, the first piezoelectric material having a first lattice constant; a second sublayer of a second piezoelectric material, the second piezoelectric material having a second lattice constant; and a third sublayer of a third piezoelectric material disposed between the first sublayer and the second sublayer, the third piezoelectric material having a third lattice constant that is distinct from the first lattice constant and from the second lattice constant.

In some embodiments, the first piezoelectric material includes scandium aluminum nitride ($Sc_yAl_{1-y}N$), where $1\%<y<45\%$, the second piezoelectric material includes scandium aluminum nitride ($Sc_zAl_{1-z}N$), where $1\%<z<45\%$, and the third piezoelectric material includes scandium aluminum nitride ($Sc_xAl_{1-x}N$), where $1\%<y<x<45\%$ and $1\%<z<x<45\%$. In some embodiments, $y=z$.

In some embodiments, each of the first piezoelectric material and the second piezoelectric material includes aluminum nitride (AlN), and the third piezoelectric material includes scandium aluminum nitride ($Sc_xAl_{1-x}N$), where $1\%<x<45\%$. In some embodiments, The composite piezoelectric film further comprises a fourth sublayer of a fourth piezoelectric material disposed between the first sublayer and the third sublayer, the fourth sublayer including scandium aluminum nitride ($ScyAl_{1-y}N$), where $1\%<y<x<45\%$. In some embodiments, the composite piezoelectric further comprises a fifth sublayer of a fifth piezoelectric material disposed between the second sublayer and the third sublayer, the fifth piezoelectric material including scandium aluminum nitride ($Sc_zAl_{1-z}N$), where $1\%<z<x<45\%$. In some embodiments, $y=z$, and the fifth sublayer and the fourth sublayer are equal in thickness.

In some embodiments, the first lattice constant is the same as the second lattice constant, and the first sublayer and the second sublayer are equal in thickness.

According to some embodiments, a composite piezoelectric film comprises a sequence of alternating sublayers of at least a first piezoelectric material (e.g., $Sc_xAl_{1-x}N$, $1\%<x<45\%$) and a second piezoelectric material (e.g., $Sc_yAl_{1-y}N$, $1\%<y<45\%$ and $y \neq x$), the first piezoelectric material having a first lattice constant, and the second piezoelectric material having a second lattice constant that is distinct from the first lattice constant. In some embodiments, material composition in the composite piezoelectric film changes at least 3 times along a thickness thereof such that a total thickness of the composite piezoelectric film is at least 4 times the thickness of a single sublayer in the sequence of alternating sublayers. In some embodiments, each sublayer in the composite piezoelectric film is 5 to 200 Angstroms in thickness. In some embodiments, the composite piezoelectric film includes at least 10 sublayers so that a total thickness of the composite piezoelectric film is at least 10 times a thickness of a single sublayer in the composite piezoelectric film. In some embodiments, at least some of the sublayers in the sequence of alternating sublayers have a same thickness According to some embodiments, a composite piezoelectric film comprises a first sequence of composition graded layers having gradually changing composition, the first sequence of composition graded layers including three of more successive layers, each having a composition of $Sc_xAl_{1-x}N$, where x is a composition fraction of Sc and a value of x monotonically increases or decreases in each successive layer in the first sequence of composition graded layers.

In some embodiments, the composite piezoelectric film further comprises, in addition to and adjacent the first sequence of composition graded layers, a second sequence of composition graded layers having gradually changing composition, where the second sequence of composition graded layers comprises three of more successive layers, each having a composition of $Sc_yAl_{1-y}N$, where y is a composition fraction of Sc, and a value of y monotonically increases or decreases in each successive layer in the second sequence of composition graded layers. In some embodiments, material composition in the composite piezoelectric film is symmetric with respect to a middle plane of the composite piezoelectric film.

According to some embodiments, a bulk acoustic resonator comprises a substrate, and a stack over the substrate, the stack including: a first electrode; a second electrode over the first electrode; and any of the composite piezoelectric film described herein between the first electrode and the second electrode. In some embodiments, the substrate includes a cavity and a frame around the cavity, and the stack is disposed over the cavity and supported by the frame. In some embodiments, the substrate includes a Bragg reflector disposed under the stack.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIGS. 8A-8G are cross-sectional diagrams illustrating formation of a bulk acoustic resonator in accordance with some embodiments.

Figure 1:
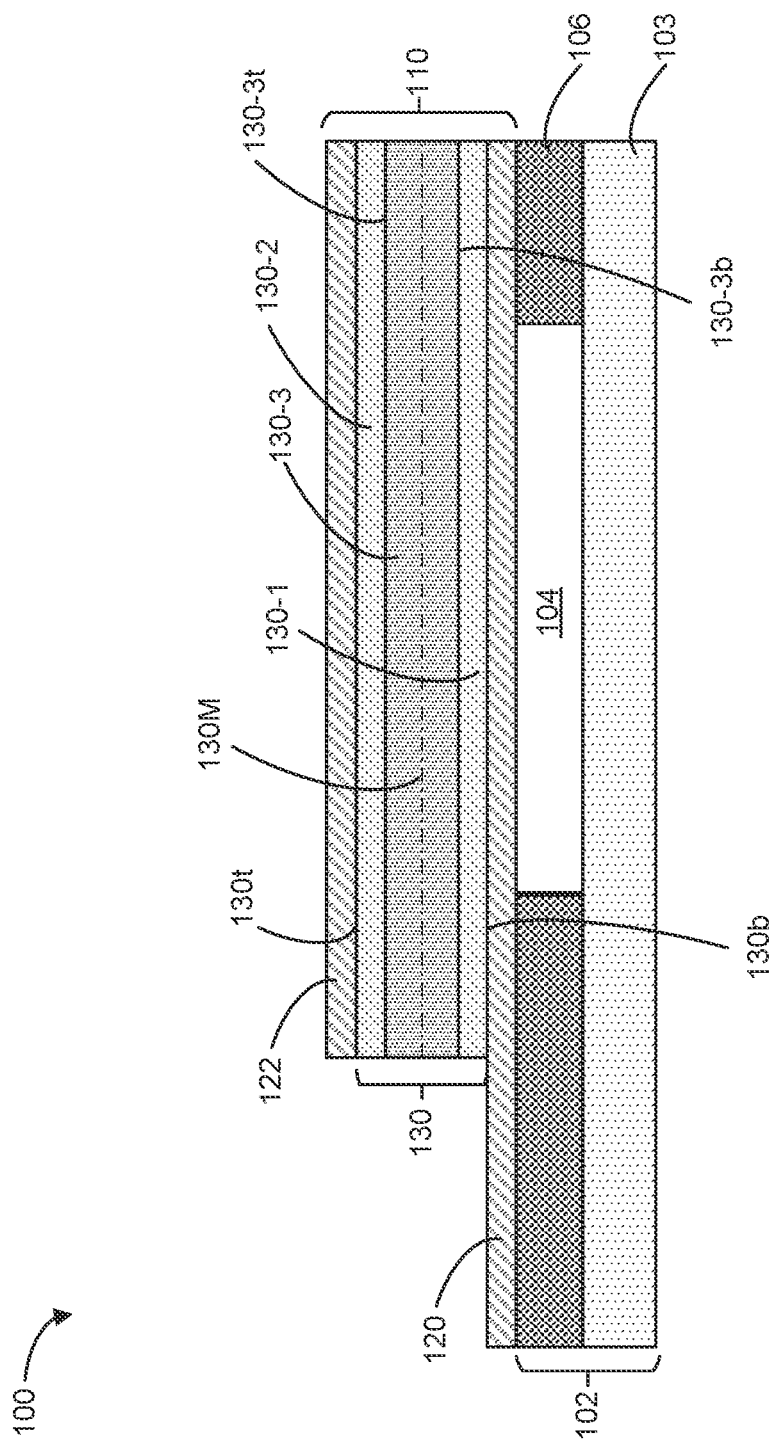
FIGS. 1-7 are cross-sectional diagrams of bulk acoustic wave resonators, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include systems, methods and/or devices with structures for improved performance and manufacturability.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

FIG. 1 is a cross-sectional diagram of a bulk acoustic wave (BAW) resonator 100, in accordance with some embodiments. The resonator 100 includes a substrate 102 and a stack 110 that is disposed over the substrate 102. The stack 110 includes a first electrode 120, a second electrode 122 that is disposed over the first electrode 120, and a composite piezoelectric film 130 that is disposed between the first electrode 120 and the second electrode 122.

In some embodiments, the substrate 102 includes a cavity 104 and a cavity frame 106 around the cavity. In such cases, the stack 110 is disposed over the cavity 104 and supported by the cavity frame 106.

In some embodiments, the composite piezoelectric film 130 includes a first sublayer 130-1, a second sublayer 130-2, and a third sublayer 130-3 that is disposed between the first sublayer 130-1 and the second sublayer 130-2. The first sublayer 130-1 includes a first piezoelectric material that has a first lattice constant, the second sublayer 130-2 includes a second piezoelectric material that has a second lattice constant, and the third sublayer 130-3 includes a third piezoelectric material that has a third lattice constant. The third lattice constant is different (e.g., distinct) from the first lattice constant and from the second lattice constant.

In some embodiments, as shown in FIG. 1, the first lattice constant is the same as the second lattice constant (e.g., the first piezoelectric material may be the same as the second piezoelectric material), while the third piezoelectric material is different or distinct from the first piezoelectric material and from the second piezoelectric material. For example, each of the first piezoelectric material and the second piezoelectric material may include aluminum nitride (AlN), and the third piezoelectric material may include scandium aluminum nitride ($Sc_xAl_{1-x}N$). A higher concentration of scandium (Sc) in the third sublayer 130-3 can provide the composite piezoelectric film 130 with a higher coupling coefficient. In some embodiment, the substrate 102 includes silicon and/or polysilicon (e.g., frame 106 includes polysilicon). Since the lattice constant of AlN approximately matches that of silicon or polysilicon, the AlN in the first sublayer 130-1 provides a transition between the substrate 102 and the $Sc_xAl_{1-x}N$ in the third sublayer 130-3 when the composite piezoelectric film 130 is formed, so as to obtain a higher quality composite piezoelectric film 130 with a higher concentration of scandium in the third sublayer 130-3. In some embodiments, x is between 1% and 45% or between 10% and 45%

In some embodiments, material composition in the composite piezoelectric film 130 is symmetric with respect to a virtual middle plane 130M of the composite piezoelectric film 130, so as to reduce or minimize distortions and harmonics in the acoustic waves carried by the resonator 100. For example, the first sublayer 130-1 and the second sublayer 130-2 include a same material (e.g., AlN) and have equal or about equal thicknesses (e.g., the difference between a first thickness of the first sublayer 130-1 and a second thickness of the second sublayer 130-2 is less than 10% or 5% of either the first thickness or the second thickness or an average of both). In some embodiments, as shown in FIG. 1, the virtual middle plane 130M of the composite piezoelectric film 130 is defined as a plane having equal distances from a top surface 130t of the composite piezoelectric film 130 and from a bottom surface 130b of the composite piezoelectric film 130. In some embodiments, a first distance between a bottom surface 130-3b of the third sublayer 130-3 and the virtual middle plane 130M is the same or about the same as a second distance between a top surface 130-3t of the third sublayer 130-3 and the virtual middle plane 130 (e.g., a difference between the first distance and the second distance is less than 10% or 5% of the first distance or the second distance or an average thereof).

Figure 2:
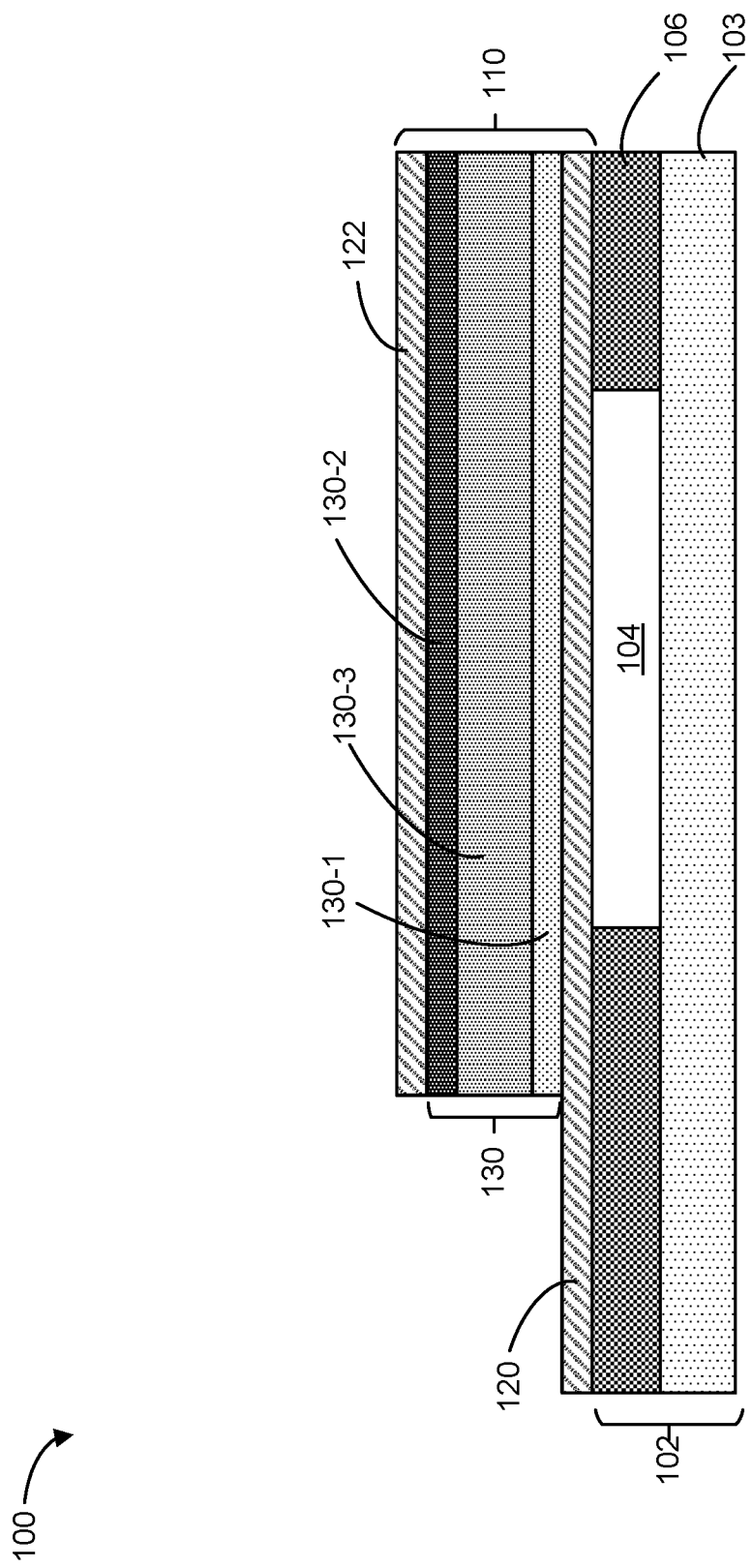

As shown in FIG. 2, the third piezoelectric material may include scandium aluminum nitride ($Sc_xAl_{1-x}N$, x is between 1% and 45%), the first piezoelectric material may include aluminum nitride (AlN) or scandium aluminum nitride ($Sc_yAl_{1-y}N$, y is between 1% and 45%), and the second piezoelectric material may include aluminum nitride (AlN) or scandium aluminum nitride ($Sc_zAl_{1-z}N$, z is between 1% and 45%).

In some embodiments, x is greater than y and greater than z. In some embodiments, the first piezoelectric material is the same as the second piezoelectric material and has a same lattice constant as that of the second piezoelectric material (e.g., y is equal or about equal to z, e.g., |y−z| is equal to or less than 10% or 5% of y or z or an average of y and z). In some embodiments, the first sublayer 130-1 and the second sublayer 130-2 have equal or about equal thicknesses (e.g., a difference between a first thickness of the first sublayer 130-1 and a second thickness of the second sublayer 130-2 is less than 10% or 5% of the first thickness or the second thickness or an average thereof), so that material composition in the composite piezoelectric film 130 is symmetric with respect to the virtual middle plane 130M of the composite piezoelectric film 130. In some embodiment, y is less than x so as to provide transition of lattice constant between the substrate 102 and the third sublayer 130-3.

Alternatively, in some embodiments, the first piezoelectric material and the second piezoelectric material may be different materials that have different lattice constants (e.g., x, y, and z are different from one another) such that the first piezoelectric material, the second piezoelectric material, and the third piezoelectric material are different materials with different lattice constants. In some embodiments, the first sublayer 130-1 and the second sublayer 130-2 can have different thicknesses.

Figure 3:
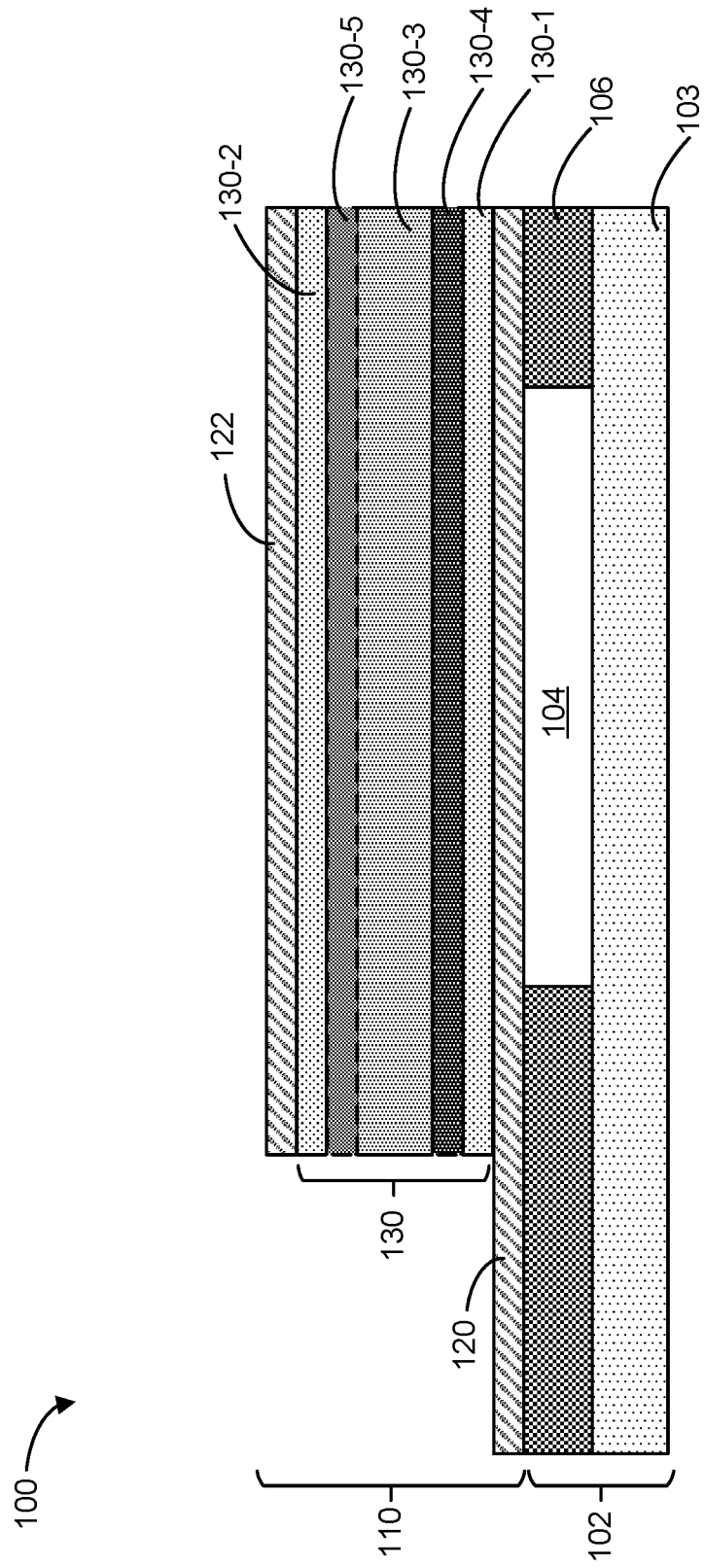

Referring to FIG. 3, in some embodiments, the composite piezoelectric film 130 further includes a fourth sublayer 130-4 disposed between the first sublayer 130-1 and the third sublayer 130-3. The fourth sublayer 130-4 includes a fourth piezoelectric material that has a fourth lattice constant. For example, the third piezoelectric material may include scandium aluminum nitride ($Sc_xAl_{1-x}N$, x is between 1% and 45%), each of the first piezoelectric material and the second piezoelectric material may include aluminum nitride (AlN), and the fourth piezoelectric material may include scandium aluminum nitride ($Sc_fAl_{1-f}N$, f is between 1% and 45%), In some embodiments, x is different from f such that the third lattice constant is different from the fourth lattice constant. In some embodiments, f is less than x such that the fourth sublayer 130-4 provides a transition between the first sublayer 130-1 and the third sublayer 130-3 when the composite piezoelectric film 130 is formed.

In some embodiments, the composite piezoelectric film 130 further includes, in addition to or instead of the fourth sublayer 130-4, a fifth sublayer 130-5 disposed between the second sublayer 130-2 and the third sublayer 130-3. The fifth sublayer 130-5 includes a fifth piezoelectric material that has a fifth lattice constant. For example, the third piezoelectric material may include scandium aluminum nitride ($Sc_xAl_{1-x}N$, y is between 1% and 45%), each of the first piezoelectric material and the second piezoelectric material may include may aluminum nitride (AlN), the fourth piezoelectric material may include scandium aluminum nitride ($Sc_fAl_{1-f}N$, f is between 1% and 45%), and the fifth piezoelectric material may include scandium aluminum nitride ($Sc_gAl_{1-g}N$, g is between 1% and 45%), In some embodiments, g is less than x.

In some embodiments, the fourth piezoelectric material is the same as the fifth piezoelectric material (e.g., f and g are the same) such that the fourth lattice constant is the same or about the same as the fifth lattice constant are the same (e.g., a difference between the fourth lattice constant and the fifth lattice constant is less than 10% or 5% of the fourth lattice constant or the fifth lattice constant or an average of both). In some embodiments, the fourth sublayer 130-4 and the fifth sublayer 130-5 also have equal or about equal thicknesses such that material composition in the composite piezoelectric film 130 is symmetric with respect to the virtual middle plane 130M of the composite piezoelectric film 130.

In some embodiments, the fourth piezoelectric material and the fifth piezoelectric material are different materials (e.g., g and f are different) such that the fourth lattice constant is different from the fifth lattice constant. In some embodiments, the fourth sublayer 130-4 and the fifth sublayer 130-5 have different thicknesses Referring to FIG. 4, in some embodiments, the composite piezoelectric film 130 may further include a sixth sublayer 130-6 disposed between the first sublayer 130-1 and the substrate 102. The sixth sublayer includes a sixth piezoelectric material that has a sixth lattice constant. For example, the third piezoelectric material may include scandium aluminum nitride ($Sc_xAl_{1-x}N$, x is between 1% and 45%), the first piezoelectric material may include scandium aluminum nitride ($Sc_yAl_{1-y}N$, y is between 1% and 45%), the second piezoelectric material may include may include scandium aluminum nitride ($Sc_zAl_{1-z}N$, z is between 1% and 45%), and the sixth piezoelectric material may include may aluminum nitride (AlN).

In some embodiments, the sixth sublayer 130-6 may have a thickness that is equal or about equal to either or any of the first sublayer 130-1 and the second sublayer 130-2.

In some embodiments, the sixth sublayer 130-6 may have a thickness that is different from either or any of the first sublayer 130-1 and the second sublayer 130-2.

Figure 5:
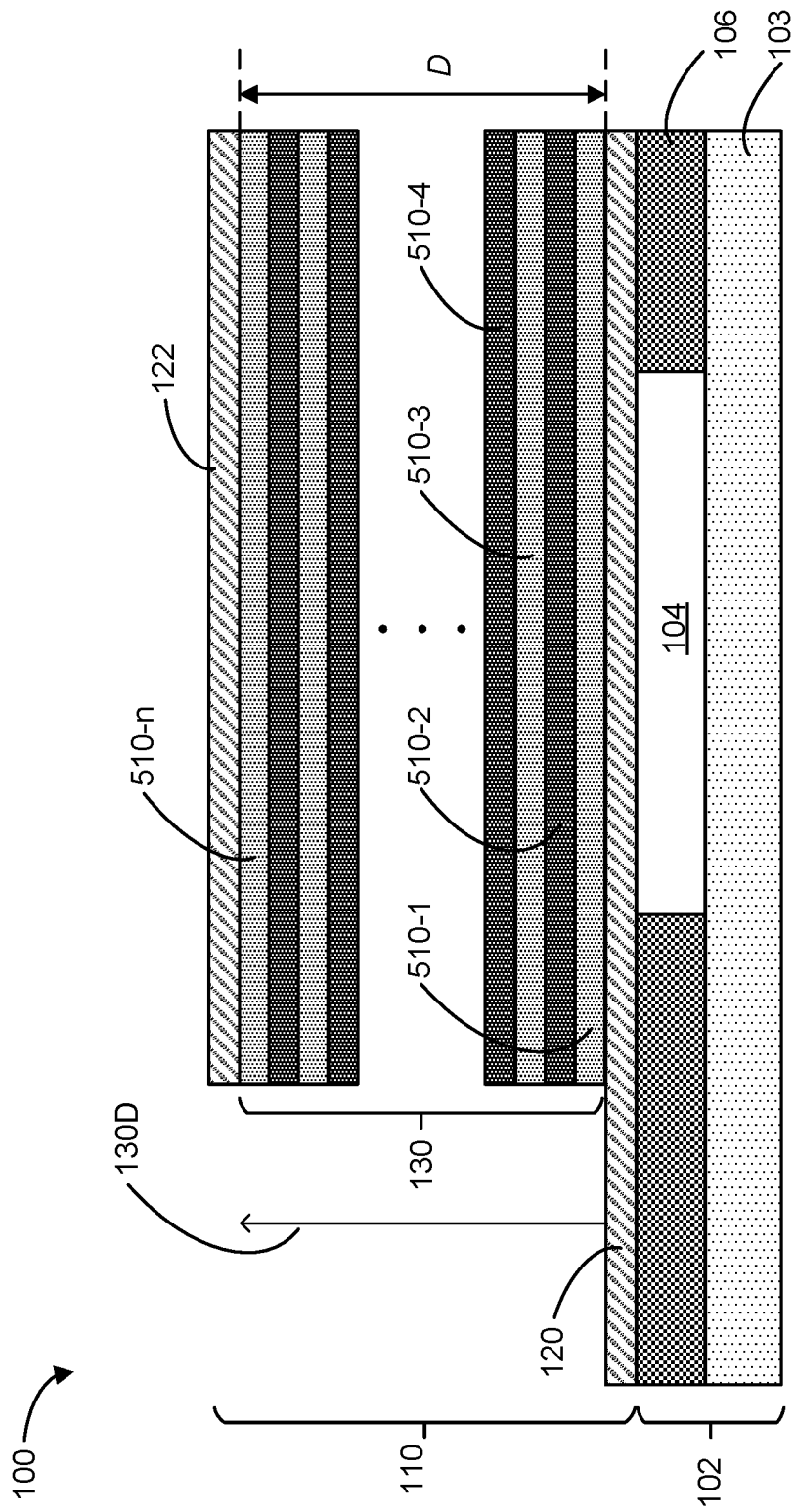

Referring to FIG. 5, in some embodiments, the composite piezoelectric film 130 may include a sequence of n alternating sublayers (e.g., sublayer 510-1, 510-2, ..., or 510-n). The alternating sublayers includes sublayers of a first piezoelectric material (illustrated as light grey rectangles) interspersed among (or interleaved with) sublayers of a second piezoelectric material (illustrated by dark grey rectangles). The first piezoelectric material has a first lattice constant and the second piezoelectric material has a second lattice constant that is distinct from the first lattice constant. In some embodiments, the material composition in the composite piezoelectric film 130 changes at least 3 times along a thickness direction 130D of the composite piezoelectric film 130 (e.g., n>3) such that a total thickness D of the composite piezoelectric film is at least 4 times the thickness of a single sublayer (e.g., a thinnest sublayer) in the sequence of sublayers. For example, the alternating sublayers may include a first sublayer 510-1, a second sublayer 510-2, a third sublayer 510-3, and a fourth sublayer 510-4. Each of the first sublayer 510-1 and the third sublayer 510-3 includes the first piezoelectric material, and each of the second sublayer 510-2 and the fourth sublayer 510-4 includes the second piezoelectric material.

In some embodiments, the first piezoelectric material includes aluminum nitride (AlN) or scandium aluminum nitride ($Sc_uAl_{1-u}N$, where u is between 1% and 45%), the second piezoelectric material includes aluminum nitride (AlN) or scandium aluminum nitride ($Sc_vAl_{1-v}N$), where v is between 1% and 45%, and v is distinct from u).

In some embodiments, each sublayer (e.g., sublayers 510-1 through 510-n) in the composite piezoelectric film 130 is 5 to 200 Angstroms in thickness.

In some embodiments, the composite piezoelectric film 130 includes at least 10 sublayers (e.g., n=10) so that a total thickness D of the composite piezoelectric film 130 is at least 10 times a thickness of a single sublayer (e.g., a thinnest sublayer) in the composite piezoelectric layer.

In some embodiments, at least some of the sublayers in the sequence of sublayers have equal or about equal thicknesses (e.g., a difference between the thicknesses of any two of these sublayers is less than 10% or 5% of the thickness of any one of these sublayers).

Figure 6:
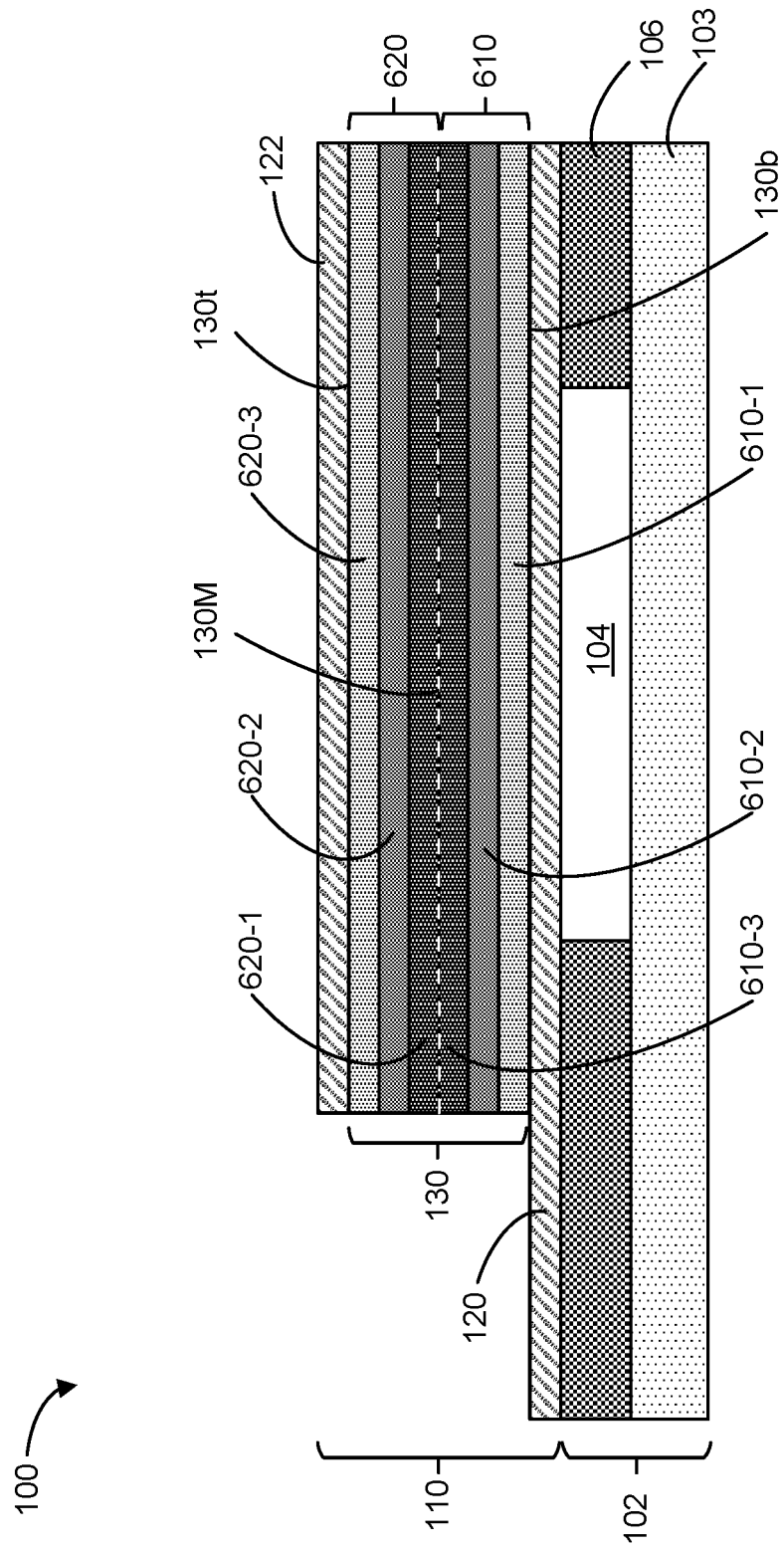

Referring to FIG. 6, in some embodiments, the composite piezoelectric film 130 includes a first sequence 610 of composition graded layers that have gradually changing compositions. The first sequence 610 of composition graded layers includes three or more successive layers (e.g., layers 610-1 through 610-3) and each layer of the first sequence 610 of composition graded layers has a composition of $Sc_pAl_{1-p}N$, where p is a composition fraction of scandium (Sc) that monotonically increases or decreases in each successive layer in the first sequence of composition graded layers. For example, the first sequence 610 of composition graded layers may include a first layer 610-1, a second layer 610-2, and a third layer 610-3 such that the value of p is lowest in the first layer 610-1 (illustrated by a light gray pattern) and highest in the third layer 610-3 (illustrated by a dark gray pattern).

In some embodiments, the composite piezoelectric film 130 further includes a second sequence 620 of composition graded layers having gradually changing composition. The second sequence 620 of composition graded layers is adjacent to the first sequence 610 of composition graded layers. The second sequence 620 of composition graded layers includes three or more successive layers. Each layer of the second sequence 620 of composition graded layers has a composition of $Sc_qAl_{1-q}N$, where q is a composition fraction of Sc that monotonically increases or decreases in each successive layer in the second sequence of composition graded layers. For example, the second sequence 620 of composition graded layers may include a first layer 620-1, a second layer 620-2, and a third layer 620-3 such that the value of q is highest in the first layer 610-1 (illustrated by a dark gray pattern) and lowest in the layer 610-3 (illustrated by a light gray pattern).

In some embodiment, material composition in the composite piezoelectric film 130 shown in FIG. 6 is symmetric with respect to a virtual middle plane 130M of the composite piezoelectric film 130 (e.g., p decreases at the same or about the same rate from the virtual middle plane 130M to the bottom surface 130-b as q decreases from the middle plane to the top surface 130t). In other words, for example, material composition of the composite piezoelectric film 130 at any first point on one side of the virtual middle plane 130M is the same or about the same as the material composition of the composite piezoelectric film 130 at a second point on the opposite side of the virtual middle plane 130M, when the first point and the second point mirror each other with respect to the virtual middle plane 130M (e.g., the first point and the second point have equal or about distances from the virtual middle plane 130M).

Figure 7:
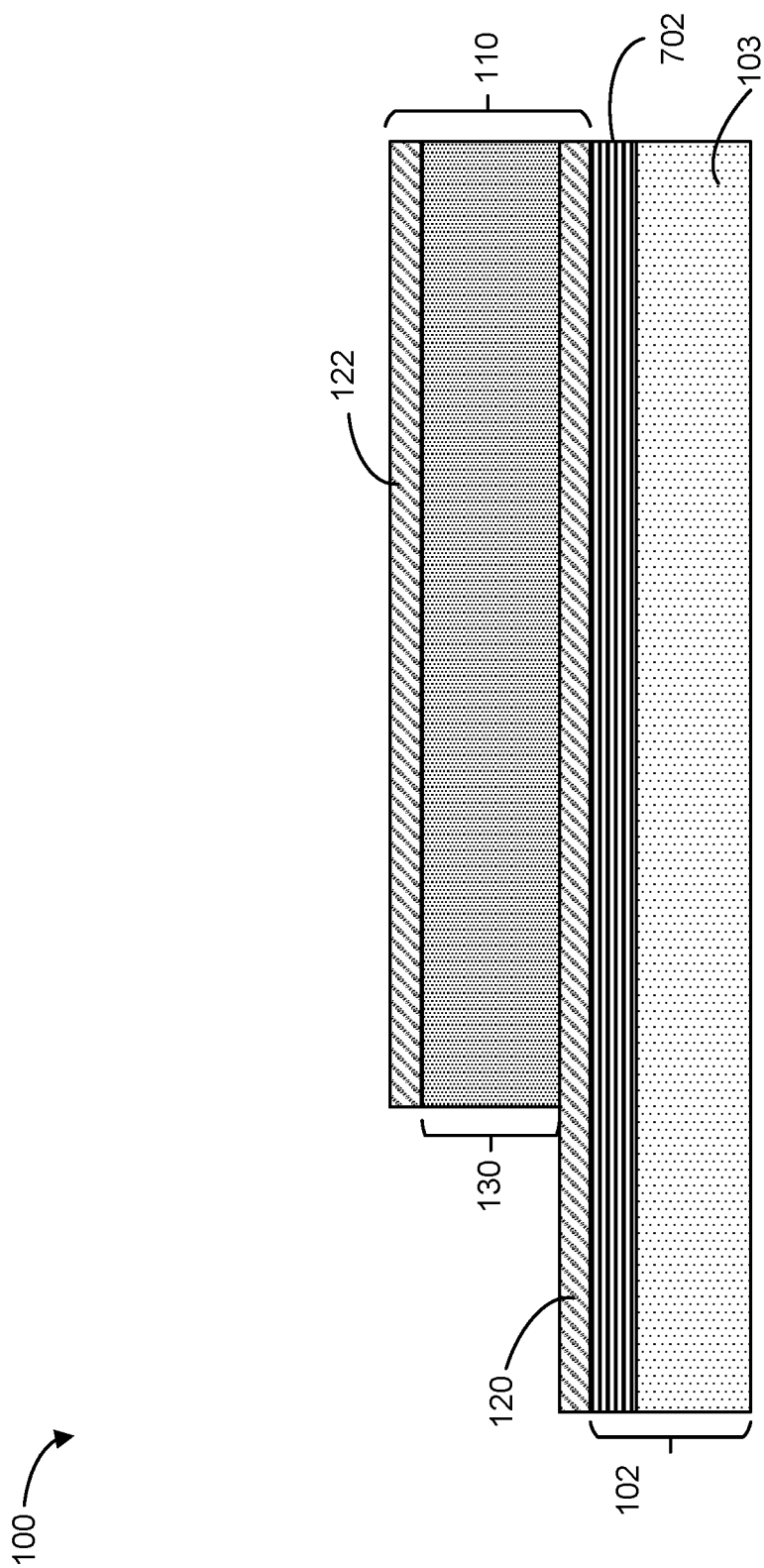

Referring to FIG. 7, in some embodiments, the substrate 102 may include a Bragg reflector 702 (e.g., instead of a cavity 104 and a cavity frame 106) and the Bragg reflector 702 is disposed under the stack 110 (e.g., the stack 110 is disposed over the Bragg reflector 702).

Figure 8D:
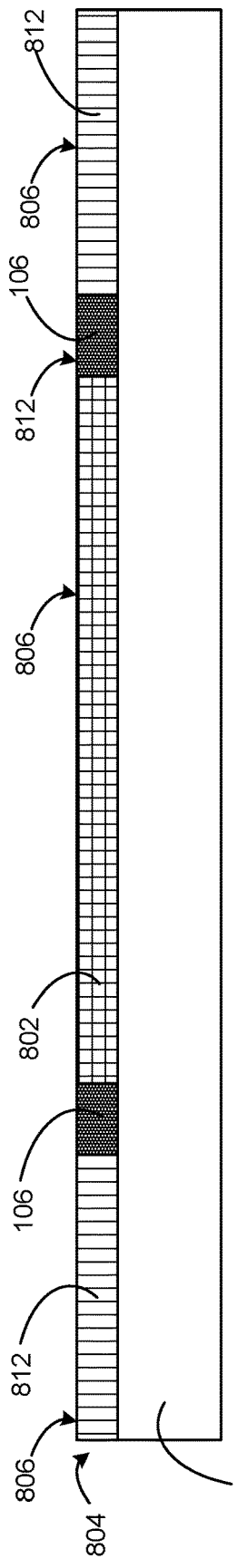
Figure 8E:
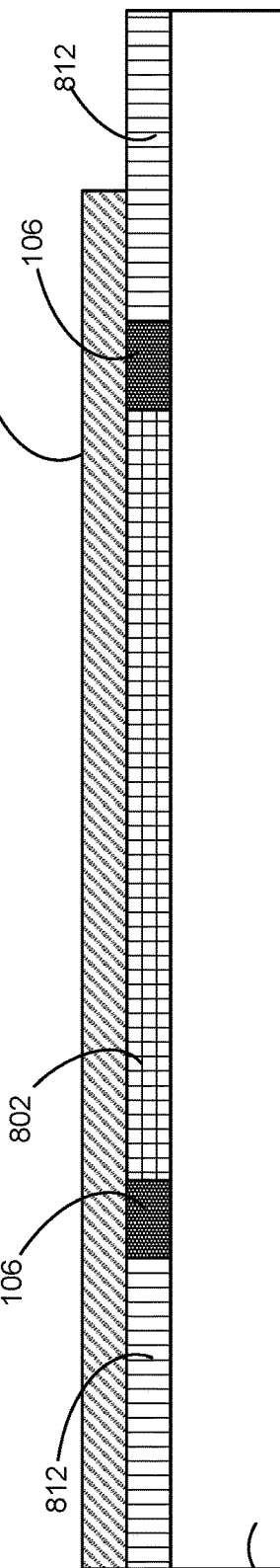
Figure 8F:
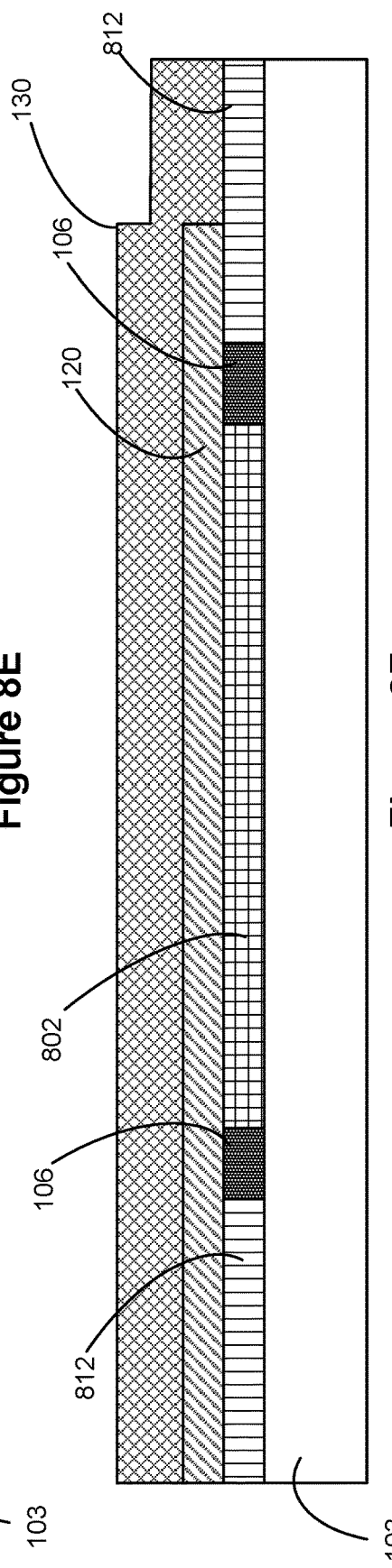
Figure 8G:
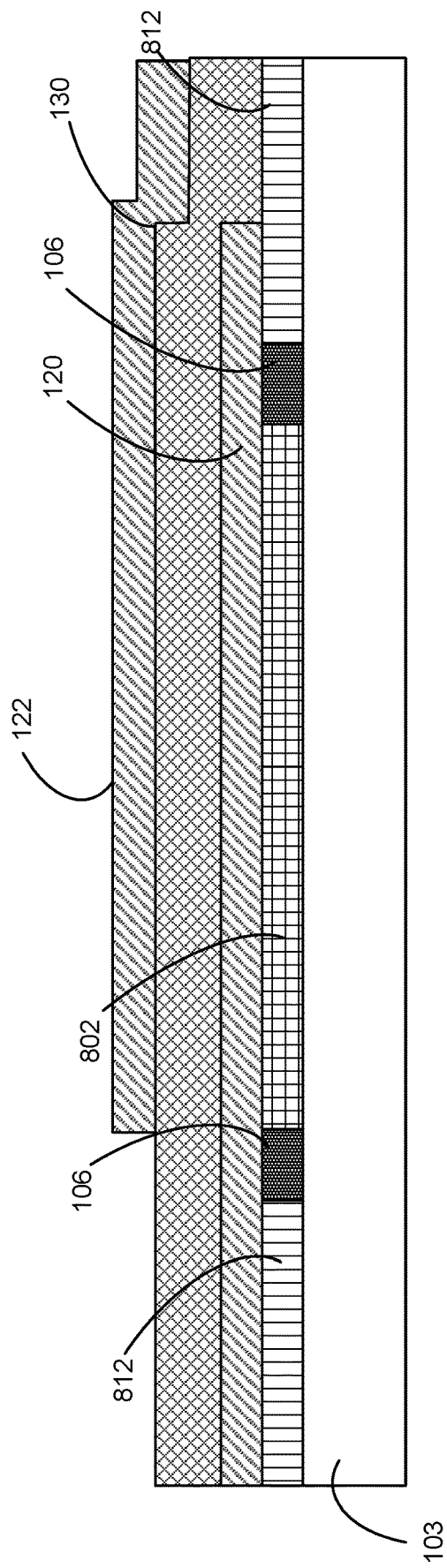
Figure 9:
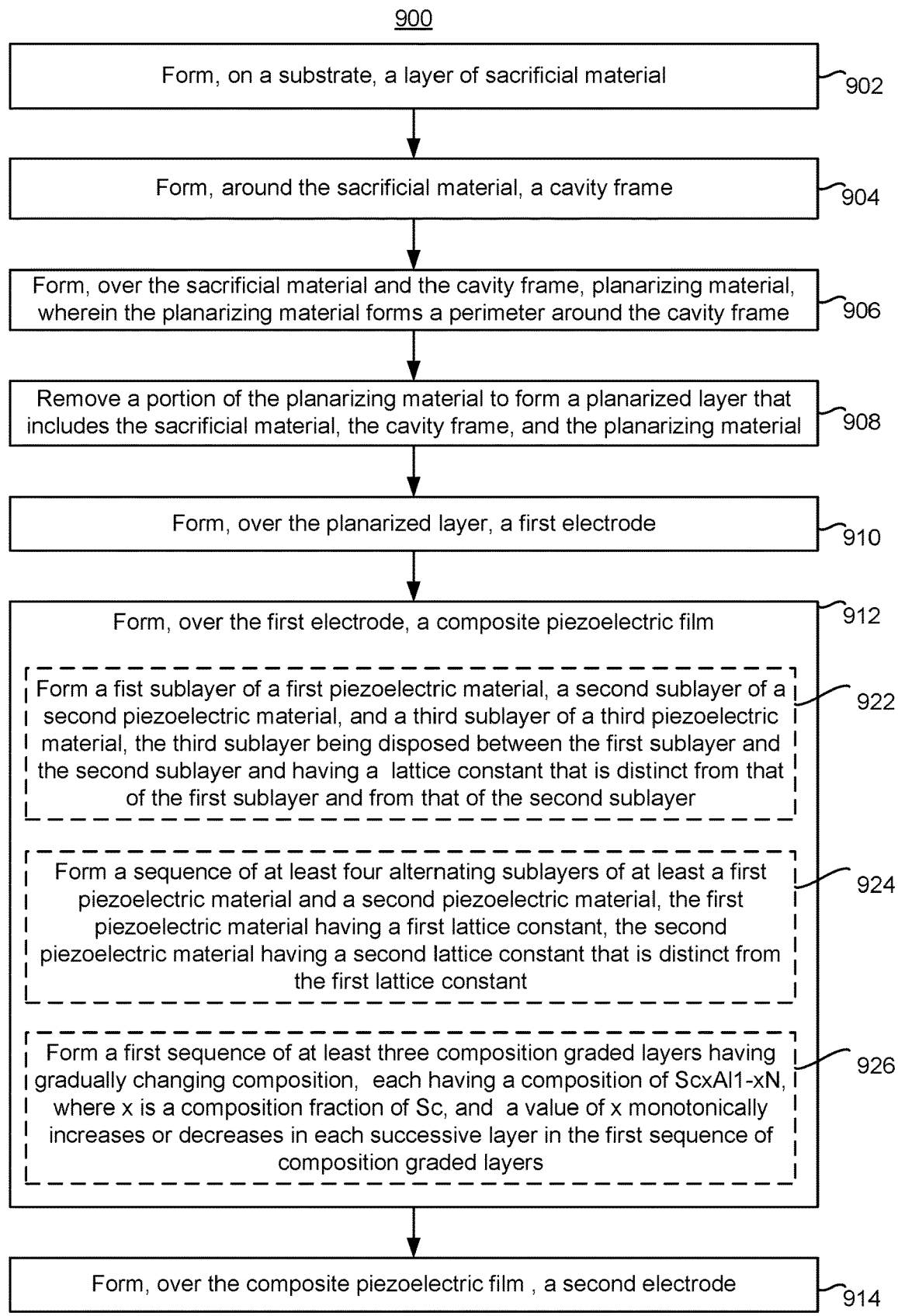
FIG. 9 illustrates a flowchart representation of a process for forming a bulk acoustic resonator in accordance with some embodiments.

The bulk acoustic wave resonator 100 can be fabricated using a process illustrated in FIGS. 8A-8G and 9, according to some embodiments. FIGS. 8A-8G illustrate cross-sectional views of a bulk acoustic resonator during formation of the bulk acoustic resonator 100. FIG. 9 illustrates a flowchart representation of a process 900 for forming a bulk acoustic resonator 100 in accordance with some embodiments.

As shown in FIGS. 8A and 9, process 900 includes forming (902) (e.g., by chemical vapor deposition) a layer of sacrificial material 802 (e.g., silicon dioxide) on a substrate 103 (e.g., silicon, glass, ceramic, gallium arsenide and/or silicon carbide). The sacrificial material is patterned (e.g., using a mask and chemical etching) such that sacrificial material 802 occupies an area on substrate 103 that corresponds to the ultimate location of cavity 114.

As shown in FIGS. 8B and 9, process 900 further includes forming (904) a cavity frame 106 (e.g., by e-beam evaporation) around sacrificial material 802. The cavity frame is patterned (e.g., using a mask during the e-beam evaporation) such that cavity frame 106 forms a perimeter around sacrificial material 802 (see FIGS. 1-3).

As shown in FIGS. 8C and 9, process 900 further includes forming (906) (e.g., by chemical vapor deposition) a planarizing material 812 (e.g. polysilicon) on the substrate 103, cavity frame 106, and sacrificial material 802.

As shown in FIGS. 8D and 9, process 900 further includes removing (908) (e.g., by chemical mechanical polishing) a portion of the planarizing material 812 to form a level upper surface 806 of a planarized layer that includes planarizing material 812, cavity frame 106, and sacrificial material 802. Planarized layer 804 is formed on, and thus positioned on top of, substrate 103.

As shown in FIGS. 8E and 9, process 900 further includes forming (910) (e.g., by physical vapor deposition) a bottom electrode layer 120 (e.g., molybdenum, aluminum, and/or tungsten) over the planarized layer that includes planarizing material 812, cavity frame 106, and sacrificial material 802. In some embodiments, bottom electrode layer 120 is patterned (e.g., using a mask during the physical vapor deposition) such that bottom electrode layer 120 occupies a region indicated by bottom electrode layer 120 in FIG. 8E.

As shown in FIGS. 8F and 9, process 900 further includes forming (912) a composite piezoelectric film 130, such as any of the ones described above with reference to FIGS. 1-6, over bottom electrode layer 120. In some embodiments, as shown in FIG. 1 or 2, the composite piezoelectric film 130 includes a first sublayer 130-1 including a first piezoelectric material having a first lattice constant, a second sublayer 130-2 including a second piezoelectric material having a second lattice constant, and a third sublayer 130-3 including a third piezoelectric material having a third lattice constant that is different from the first lattice constant and from the second lattice constant. In some embodiments, forming (920) the composite piezoelectric film 130 over bottom electrode layer 120 includes forming (922) the first sublayer 130-1 over the bottom electrode layer 120, the third sublayer 130-3 over the first sublayer 130-1, and the second sublayer 130-2 over the third sublayer 130-3. Each of the sublayers can be epitaxially grown and/or physically deposited (e.g., by physical vapor deposition).

In some embodiments, as shown in FIG. 3, the composite piezoelectric film 130 further includes a fourth sublayer 130-4 including a fourth piezoelectric material having a fourth lattice constant, and forming (912) the composite piezoelectric film 130 over bottom electrode layer 120 includes forming (922) the first sublayer 130-1 over the bottom electrode layer 120, the fourth sublayer 130-4 over the first sublayer 130-1, the third sublayer 130-3 over the fourth sublayer 130-4, and the second sublayer 130-2 over the third sublayer 130-3. Each of the sublayers can be epitaxially grown and/or physically deposited (e.g., by physical vapor deposition).

In some embodiments, as shown in FIG. 3, the composite piezoelectric film 130 further includes, in addition to or instead of the fourth sublayer 130-4, a fifth sublayer 130-5 including a fifth piezoelectric material that has a fifth lattice constant, and forming (912) the composite piezoelectric film 130 over bottom electrode layer 120 includes forming (922) the first sublayer 130-1 over the bottom electrode layer 120, optionally forming the fourth sublayer 130-4 over the first sublayer 130-1, forming the third sublayer 130-3 over the first sublayer 130-1 or the fourth sublayer 130-4, forming the fifth sublayer 130-5 over the third sublayer 130-3, and forming the second sublayer 130-2 over the third sublayer 130-3. Each of the sublayers can be epitaxially grown and/or physically deposited (e.g., by physical vapor deposition).

Figure 4:
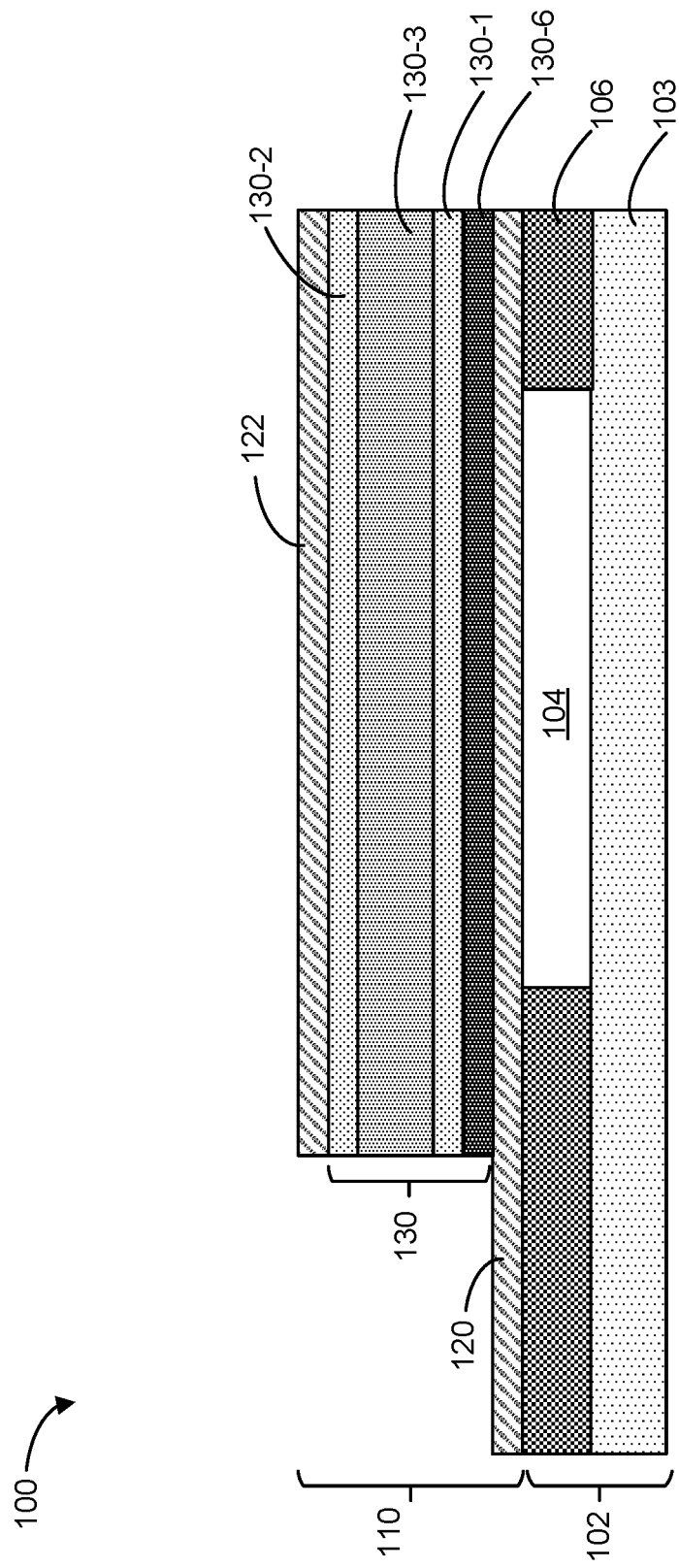

In some embodiments, as shown in FIG. 4, the composite piezoelectric film 130 further includes, a sixth sublayer 130-6 including a sixth piezoelectric material having a sixth lattice constant, and forming (912) the composite piezoelectric film 130 over bottom electrode layer 120 includes forming (922) the sixth sublayer 130-6 over the bottom electrode layer 120, forming the first sublayer 130-1 over the sixth sublayer 130-6, and so forth.

In some embodiments, as shown in FIG. 5, the composite piezoelectric film 130 includes a sequence of n alternating sublayers (e.g., n>3) including sublayers of a first piezoelectric material interspersed among sublayers of a second piezoelectric material, and forming (912) the composite piezoelectric film 130 over bottom electrode layer 120 includes forming (924) sublayer 510-1 of the first piezoelectric material over the bottom electrode layer 120, sublayer 510-2 of the second piezoelectric material over sublayer 510-1, sublayer 510-3 of the first piezoelectric material over sublayer 510-2, and so forth. Each of the sublayers can be epitaxially grown and/or physically deposited (e.g., by physical vapor deposition).

In some embodiments, as shown in FIG. 6, the composite piezoelectric film 130 includes a first sequence 610 of composition graded layers that have gradually changing compositions, and forming (912) the composite piezoelectric film 130 over bottom electrode layer 120 includes forming (926) sublayer 610-1 of a piezoelectric material having a first composition over the bottom electrode layer 120, sublayer 610-2 of a piezoelectric material having a second composition over sublayer 610-1, sublayer 610-3 of a piezoelectric material having a third composition over sublayer 610-2, and so forth if the first sequence 610 includes more sublayers. Each of the sublayers can be epitaxially grown and/or physically deposited (e.g., by physical vapor deposition).

In some embodiments, as shown in FIG. 6, the composite piezoelectric film 130 further includes a second sequence 620 of composition graded layers that have gradually changing compositions, and forming (912) the composite piezoelectric film 130 over bottom electrode layer 120 further includes forming (926) sublayer 620-1 of the piezoelectric material having a third composition over sublayer 610-3, sublayer 620-2 of a piezoelectric material having the second composition over sublayer 620-1, and sublayer 620-3 of a piezoelectric material having the first composition over sublayer 620-2. Each of the sublayers can be epitaxially grown and/or physically deposited (e.g., by physical vapor deposition).

As shown in FIGS. 8G and 9, process 900 further includes forming (914) a top electrode layer 104 (e.g., molybdenum, aluminum, and/or tungsten) over the piezoelectric film layer 102. In some embodiments, top electrode layer 122 is patterned (e.g., using a mask during the physical vapor deposition) such that top electrode layer 122 occupies the region indicated by top electrode layer 122 in FIG. 8G.

In some embodiments, a cavity 104 is formed by removing the sacrificial material 802 (e.g., by vapor HF etching) from beneath bottom electrode 120. Vapor HF etching advantageously reduces the etch time (e.g., compared with liquid HF) and provides a clean surface of the bottom electrode. In some embodiments, the cavity 104 has a depth and shape that corresponds to the opening of cavity frame 106. In this way, the formation of cavity frame 106 allows formation of a cavity with a predetermined depth and shape.

In some embodiments, instead of forming (902) the layer of sacrificial material 802, forming (904) the cavity frame 106, forming (906) the planarizing material 812, and planarizing (908) the planarizing material 812, a Bragg reflector 702 is formed over the substrate 103. The first electrode layer 120 is formed over the Bragg reflector 702 and the composite piezoelectric film is formed over the first electrode layer 120, as shown in FIG. 7.

In some embodiments, the cavity frame 106 is configured to dissipate heat generated by the stack. In some embodiments, the cavity frame 106 is formed from one or more materials that have a thermal conductivity at 20° C. of at least 200 W/(m K).

In some embodiments, the cavity frame 106 includes at least one material selected from the group consisting of aluminum, copper, silver, gold, and diamond.

Process 900 for forming a bulk acoustic resonator 100 (as described above with regard to FIGS. 8A-8G and 9) involves, e.g., epitaxy, deposition, oxidation, lithography patterning, etch, liftoff, and/or chemical mechanical planarization processes, in appropriate sequences, as described above. While these sequences of operations, and the resulting bulk acoustic resonators, are new, the techniques needed to perform each of the individual steps or operations of these processes are well understood in the art, and therefore the individual processing steps or operations are not described in detail. The dashed lines in process 900 illustrate optional or alternative operations.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A composite piezoelectric film, comprising:
a first sublayer of a first piezoelectric material, the first piezoelectric material has a first lattice constant;
a second sublayer of a second piezoelectric material, the second piezoelectric material has a second lattice constant;
a third sublayer of a third piezoelectric material disposed between the first sublayer and the second sublayer, the third piezoelectric material has a third lattice constant that is distinct from the first lattice constant and from the second lattice constant wherein:
each of the first piezoelectric material and the second piezoelectric material includes aluminum nitride (AlN) and does not include scandium aluminum nitride; and
the third piezoelectric material includes scandium aluminum nitride ($Sc_xAl_{1-x}N$), and x is between 1% and 45%;
a fourth sublayer of a fourth piezoelectric material disposed between the first sublayer and the third sublayer, the fourth sublayer including scandium aluminum nitride ($Sc_yAl_{1-y}N$), wherein:
y is between 1% and 45%; and
y is less than x.

2. A composite piezoelectric film, comprising:
a first sublayer of a first piezoelectric material, the first piezoelectric material has a first lattice constant;
a second sublayer of a second piezoelectric material, the second piezoelectric material has a second lattice constant;
a third sublayer of a third piezoelectric material disposed between the first sublayer and the second sublayer, the third piezoelectric material has a third lattice constant that is distinct from the first lattice constant and from the second lattice constant wherein:
each of the first piezoelectric material and the second piezoelectric material includes aluminum nitride (AN); and
the third piezoelectric material includes scandium aluminum nitride ($Sc_xAl_{1-x}N$), and x is between 1% and 45%;
a fourth sublayer of a fourth piezoelectric material disposed between the first sublayer and the third sublayer, the fourth sublayer includes scandium aluminum nitride ($Sc_yAl_{1-y}N$), wherein:
y is between 1% and 45%; and
y is less than x; and
a fifth sublayer of a fifth piezoelectric material disposed between the second sublayer and the third sublayer, the fifth piezoelectric material including scandium aluminum nitride ($Sc_zAl_{1-z}N$), wherein:
z is between 1% and 45%; and
z is less than x.

3. The composite piezoelectric film of claim 2, wherein y is equal to z, and wherein the fifth sublayer and the fourth sublayer have a same thickness.

4. A composite piezoelectric film, comprising:
a first sublayer of a first piezoelectric material, the first piezoelectric material has a first lattice constant;
a second sublayer of a second piezoelectric material, the second piezoelectric material has a second lattice constant;
a third sublayer of a third piezoelectric material disposed between the first sublayer and the second sublayer, the third piezoelectric material has a third lattice constant that is distinct from the first lattice constant and from the second lattice constant wherein:
the first piezoelectric material includes scandium aluminum nitride ($Sc_yAl_{1-y}N$), and y is between 1% and 45%;
the second piezoelectric material includes scandium aluminum nitride ($Sc_zAl_{1-z}N$), and z is between 1% and 45%;
the third piezoelectric material includes scandium aluminum nitride ($Sc_xAl_{1-x}N$), and x is between 1% and 45%; and
x greater than y, and x is greater than z.

5. The composite piezoelectric film of claim 4, wherein y is equal to z.

6. The composite piezoelectric film of claim 4, further comprising:
a fourth sublayer of a fourth piezoelectric material, the fourth piezoelectric material including aluminum nitride (AlN), wherein the first sublayer is between the third sublayer and the fourth sublayer.

7. The composite piezoelectric film of claim 2, wherein the first lattice constant is the same as the second lattice constant, and the first sublayer and the second sublayer have a same thickness.

8. A composite piezoelectric film, comprising:
a sequence of alternating sublayers of at least a first piezoelectric material and a second piezoelectric material, the first piezoelectric material having a first lattice constant, the second piezoelectric material having a second lattice constant that is distinct from the first lattice constant, wherein material composition in the composite piezoelectric film changes at least 3 times along a thickness thereof and a total thickness of the composite piezoelectric film is at least 4 times the thickness of one of the sublayers in the sequence of alternating sublayers.

9. The composite piezoelectric film of claim 8, wherein the composite piezoelectric film comprises the sequence of alternating sublayers of at least the first piezoelectric material and the second piezoelectric material, and wherein:
the first piezoelectric material includes scandium aluminum nitride ($Sc_xAl_{1-x}N$), and x is between 1% and 45%;
the second piezoelectric material includes scandium aluminum nitride ($Sc_yAl_{1-y}N$), and y is between 1% and 45%; and
y is distinct from x.

10. The composite piezoelectric film of claim 8, wherein each sublayer in the sequence of alternating sublayers is 5 to 200 Angstroms in thickness.

11. The composite piezoelectric film of claim 8, wherein the sequence of alternating sublayers includes at least 10 sublayers and the total thickness of the composite piezoelectric film is at least 10 times the thickness of one of the sublayers in the sequence of alternating sublayers.

12. The composite piezoelectric film of claim 8, wherein:
at least some of the sublayers in the sequence of alternating sublayers have a same thickness.

13. The composite piezoelectric film of claim 9, wherein material composition in the composite piezoelectric film is symmetric with respect to a middle plane of the composite piezoelectric film.

14. A bulk acoustic resonator, comprising:
a substrate; and
a stack over the substrate, the stack including:

a first electrode;
a second electrode over the first electrode; and
a composite piezoelectric film between the first electrode and the second electrode, the composite piezoelectric film comprising:
a sequence of alternating sublayers of at least a first piezoelectric material and a second piezoelectric material, the first piezoelectric material having a first lattice constant, the second piezoelectric material having a second lattice constant that is distinct from the first lattice constant, wherein material composition in the composite piezoelectric film changes at least 3 times along a thickness thereof and a total thickness of the composite piezoelectric film is at least 4 times the thickness of one of the sublayers in the sequence of alternating sublayers.

15. The bulk acoustic resonator of claim 14, wherein:
the substrate includes a cavity and a frame around the cavity; and
the stack is disposed over the cavity and supported by the frame.

16. The bulk acoustic resonator of claim 14, wherein the substrate includes a Bragg reflector disposed under the stack.

\* \* \* \* \*